United States Patent [19]

Saito et al.

[11] Patent Number: 4,894,801
[45] Date of Patent: Jan. 16, 1990

[54] STACKED MOS TRANSISTOR FLIP-FLOP MEMORY CELL

[75] Inventors: Ryuichi Saito, Tokyo; Naohiro Momma, Hitachi, both of Japan

[73] Assignee: Hitachi, Ltd., Tokyo, Japan

[21] Appl. No.: 77,176

[22] Filed: Jul. 24, 1987

[30] Foreign Application Priority Data

Aug. 1, 1986 [JP] Japan .................................. 61-179969

[51] Int. Cl.$^4$ .......................... G11C 7/00; G11C 11/40
[52] U.S. Cl. ..................................... 365/154; 365/182; 365/189.01
[58] Field of Search ................ 365/154, 174, 180, 206, 365/182; 357/40, 41, 59, 23.1

[56] References Cited

U.S. PATENT DOCUMENTS

| 4,198,695 | 4/1980 | McElroy | 365/154 |
| 4,213,139 | 7/1980 | Rao | 357/23.9 X |
| 4,223,333 | 9/1980 | Masuoka | 365/154 X |
| 4,322,824 | 3/1982 | Allan | 365/174 X |
| 4,402,063 | 8/1983 | Wittwer | 365/154 |
| 4,471,374 | 9/1984 | Hardee | 365/154 X |
| 4,481,524 | 11/1984 | Tsujide | 365/156 X |
| 4,541,006 | 9/1985 | Ariizumi et al. | 365/182 |
| 4,550,390 | 10/1985 | Akashi | 365/174 |
| 4,675,715 | 6/1987 | Lepselter | 357/34 X |

FOREIGN PATENT DOCUMENTS 60-111458 6/1985 Japan .

Primary Examiner—Stuart N. Hecker
Assistant Examiner—Alyssa H. Bowler
Attorney, Agent, or Firm—Antonelli, Terry & Wands

[57] ABSTRACT

A semiconductor memory including two cross-coupled driver MOS transistors respectively having source and drain regions within a semiconductor substrate and each of the drain regions being in ohmic contact with the gate electrode of the other driver MOS transistor. The gate electrodes of the driver MOS transistors are formed in a first-level polycrystalline silicon (polysilicon) layer and the two transfer MOS transistors respectively have their source and drain regions formed in portions of a second-level polysilicon layer. The driver regions are formed so as to be independently brought into ohmic contact with the respective drain regions of the driver MOS transistors, and each of the transfer MOS transistors have a gate electrode effected in a third-level polysilicon layer which also defines a word line. Two load resistors are respectively formed in those regions of the second-level polysilicon layer which extend from the drain regions of the transfer MOS transistors to a power supply potential line, and wherein the corresponding regions of the load resistors are connected to the power supply potential line in the second-level polysilicon layer. Two metallic data lines are respectively brought into ohmic contact with the source regions of the two transfer MOS transistors and wherein the ground wirings of the memory cell are respectively defined by extending portions of the source regions of the two driver MOS transistors.

26 Claims, 1 Drawing Sheet

STACKED MOS TRANSISTOR FLIP-FLOP MEMORY CELL

BACKGROUND OF THE INVENTION

The present invention relates to a semiconductor memory and, more particularly, to an improved semiconductor memory achieving high integration, such as a static RAM formed using MOS transistors.

In a static RAM, one memory cell is defined by a bistable flip-flop and is generally constituted by six elements. FIG. 1 is an equivalent circuit diagram of a memory cell used in a known E/R type static RAM. As illustrated, the memory cell is composed of a total of six elements, that is, two driver elements defined by enhancement type MOS transistors $Q_1$ and $Q_2$ that constitute a flip-flop, two load elements defined by resistors $R_1$, and $R_2$ and two transfer gate elements for address selection which are defined by enhancement type MOS transistors $Q_3$ and $Q_4$. In the figure, the reference character W denotes a word line, $\overline{D}$, D data lines, GND a ground potential, Vcc a power supply potential, and $N_1$, $N_2$ nodes. These elements are formed so as to be appropriately arranged on a semiconductor substrate. Generally, in a MOS semiconductor memory, the source and drain regions of the enhancement type MOS transistors $Q_1$ to $Q_4$ are formed within the semiconductor substrate, and the gate electrodes thereof are formed using a first-level polycrystalline silicon layer. The resistors $R_1$ and $R_2$ are formed within a second-level polycrystalline silicon layer. Such a configurational structure enables the static RAM to have a relatively high integration density.

However, the great demand for an even higher integration of semiconductor integrated circuit devices requires further miniaturization and an improvement in the configurational structure of elements within each memory cell. Under these circumstances, a method wherein one of the driver MOS transistors is formed in silicon on an insulator (Silicon On Insulator; SOI) has been proposed (see Japanese Patent Laid-Open No. 111458/1985). More specifically, a part of the first-level polycrystalline silicon stacked on a field insulator film is formed into a single crystal by means of the laser annealing method, and the source and drain regions of one of the driver MOS transistors are formed in this single crystal region. The gate electrode of this driver MOS transistor is formed using a second-level polycrystalline silicon layer. In this way, the element area is reduced, and the number of contacts between the gates and drains of the driver MOS transistors is decreased, thereby improving the reliability.

In the above-described structure wherein one of the driver MOS transistors is formed in SOI, the driver MOS transistor formed in SOI is disposed in a region which has conventionally been occupied by a driver MOS transistor formed within the semiconductor substrate. Therefore, it is essentially impossible to expect a substantial reduction in the element area. Further, since the described element structure causes a reduction in the junction capacitance of the node to which is connected the drain of the driver MOS transistor formed in SOI, the required amount of signal charge at this node cannot be ensured, so that there is a fear of data being readily lost as a result of disturbance such as by alpha particles. In addition, since the two driver MOS transistors have different substrates, it is difficult to make the characteristics of these transistors uniform, so that it is difficult to form a memory cell which is capable of performing a balanced operation.

SUMMARY OF THE INVENTION

It is an object of the present invention to provide a semiconductor memory which is so designed that the area of each memory cell is considerably reduced and yet the required node capacitance is ensured.

To this end, the present invention provides a semiconductor memory including two driver MOS elements constituting a flip-flop, two resistor elements and two transfer MOS elements for address selection, which comprises: source and drain regions of the two transfer MOS elements for address selection which are disposed within a second-level polycrystalline silicon layer; and gate electrodes of the two transfer MOS elements which are disposed in a part of a third-level polycrystalline silicon layer.

More specifically, the above-described object is attained by a semiconductor memory which comprises: a first driver MOS transistor having source and drain regions within a semiconductor substrate and a gate electrode defined by the intersection between the source and drain regions and a first-level polycrystalline silicon layer which crosses the source and drain regions; a second driver MOS transistor having independent source and drain regions within the semiconductor substrate, the drain region being in ohmic contact with the gate electrode of the first driver MOS transistor, the second driver MOS transistor having a gate electrode defined by the intersection between the source and drain regions and a second first-level polycrystalline silicon layer which is formed so as to cross the source and drain regions and having one end thereof brought into ohmic contact with the drain region of the first driver MOS transistor; two transfer MOS transistors respectively having source and drain regions defined by extending portions of first and second branched second-layer polycrystalline silicon layers which are independently branched from a second-level polycrystalline silicon layer formed as a power supply potential line and which are formed so as to be independently brought into ohmic contact with the respective drain regions of the first and second driver MOS transistors, the extending portions extending beyond the corresponding ohmic contact portions, the drain region of each of the transfer MOS transistors being defined by the side of the extending portion which is closer to the corresponding ohmic contact portion, and each of the transfer MOS transistors having a gate electrode defined by the intersection between the corresponding source and drain regions and a third-level polycrystalline silicon layer which crosses the source and drain regions, the third-level polycrystalline silicon layer defining a word line; two load resistors respectively formed in those regions of the first and second branched second-level polycrystalline silicon layers which are located between the corresponding ohmic contact portions and a corresponding line for coupling to a power supply; two metallic data lines respectively brought into ohmic contact with the source regions of the two transfer MOS transistors; and ground wirings respectively defined by the extending portions of the source regions of the two driver MOS transistors.

By virtue of the above-described arrangement, the transfer MOS transistors are formed in such a manner as to be stacked on the driver MOS transistors formed within the semiconductor substrate. Therefore, the memory cell area is reduced considerably. Since the junction area of each node is not reduced despite the reduction in the memory cell area, the required node capacitance is ensured, so that the resistance to disturbance such as alpha partices is improved as compared with the conventional cell having the same area. Further, since the two driver MOS transistors which constitute a flip-flop are formed within a single crystal silicon substrate as in the prior art, the stable operation of the memory cell is ensured. In addition, since the number of contact portions between the gate electrodes and the drains of the driver MOS transistors is reduced, the reliability is improved.

DETAILED DESCRIPTION OF THE PREFERRED EMBODIMENT

Figure 1:
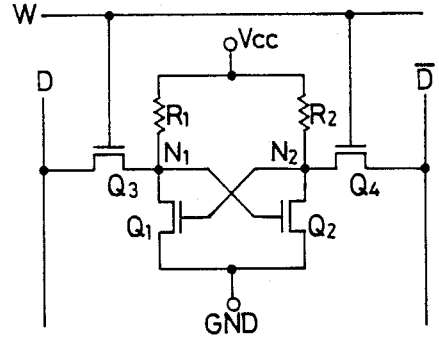
FIG. 1 is an equivalent circuit diagram of a memory cell in a known E/R type static RAM.
Figure 2:
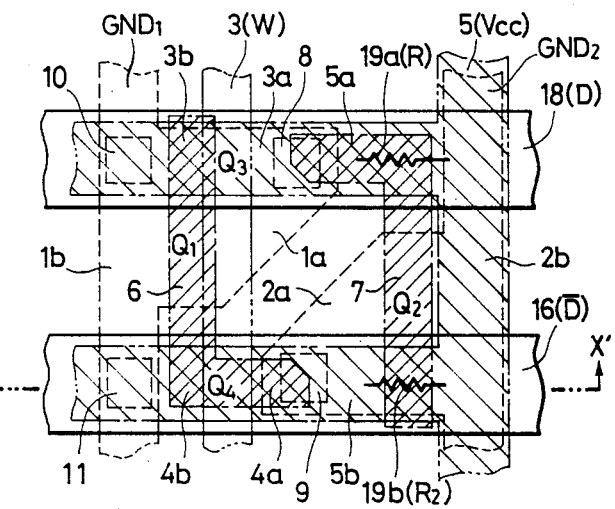
FIG. 2 shows the configurational structure of circuit elements of a memory cell in a static RAM in accordance with one embodiment of the present invention.

One embodiment of the present invention will be described hereinunder with reference to the accompanying drawings. FIG. 2 shows the configurational structure of circuit elements of a memory cell in a static RAM to which the present invention is applied. The memory cell in accordance with this embodiment is composed of the following elements: a driver MOS transistor $Q_1$ having a gate electrode defined by the intersection between on the one hand n+-layers 1a, 1b to be source and drain regions and on the other a first-level polycrystalline silicon layer 6 which crosses the n+-layers 1a, 1b at right angles; another driver MOS transistor $Q_2$ having a gate electrode defined by the intersection between on the one hand n+-layers 2a, 2b to be source and drain regions and on the other a first-level polycrystalline silicon layer 7 which crosses the n+-layer 2a, 2b at right angles; a transfer MOS transistor $Q_3$ having a gate electrode defined by the intersection between on the one hand n+-layers 3a, 3b defined by the portion of a second-level polycrystalline silicon layer 5 connected to the n+-layer 1a through an ohmic contact portion 8 which portion extends beyond the ohmic contact portion 8 and on the other a third-level polycrystalline silicon layer 3 which crosses the n+-layers 3a, 3b at right angles; another transfer MOS transistor $Q_4$ having a gate electrode defined by the intersection between on the one hand n+-layers 4a, 4b defined by the portion of the second-level polycrystalline silicon layer 5 connected to the n+-layer 2a through an ohmic contact portion 9 which portion extends beyond the ohmic contact portion 9 and on the other the third-level polycrystalline silicon layer 3 which crosses the n+-layers 4a, 4b at right angles; and load resistors $R_1$ (19a) $R_2$ (19b) respectively formed in branch layers 5a and 5b of the second-level polycrystalline silicon layer 5 which are defined between the ohmic contact portions 8, 9 and the respective joints. The third-level polycrystalline silicon layer 3 is employed as a word line W, while the second-level polycrystalline silicon layer 5 is utilized as a power supply potential line Vcc. The source regions of the driver MOS transistors $Q_1$ and $Q_2$ are utilized as ground potential lines $GND_1$ and $GND_2$, respectively. The gate electrode 6 of the driver MOS transistor $Q_1$ is connected to the drain region of the driver MOS transistor $Q_2$ through the ohmic contact portion 9, while the gate electrode 7 of the driver MOS transistor $Q_2$ is connected to the drain region of the driver MOS transistor $Q_1$ through the ohmic contact portion 8. The source regions of the transfer MOS transistors $Q_3$ and $Q_4$ are connected to data lines D (18) and $\overline{D}$ (16) through ohmic contact portions 10 and 11, respectively. The source or drain regions of the transfer MOS transistors $Q_3$ and $Q_4$ are formed integrally with the load resistors $R_1$ and $R_2$ within the respective branch layers of the second-level polycrystalline silicon layer 5. Thus, the circuit connection of the memory cell is completed. The ground potential lines may be reinforced with a metallic electrode which is provided for each cell group which consists of a plurality of memory cells in order to lower the resistance. Alternatively, the ground potential lines may be connected to, for example, the third-level polycrystalline silicon for each memory cell to thereby lower the resistance. Further, for example, the third-level polycrystalline silicon may be stacked through an insulator film on the n+-layer between the drain region of each transfer MOS transistor and the corresponding load resistor, thereby increasing the node capacitance, and thus further enhancing the resistance to disturbance such as alpha particles.

As will be clear from the element arrangement in accordance with this embodiment, the memory cell in the static RAM according to the present invention has transfer MOS transistors stacked three-dimensionally, and the memory cell area is therefore reduced considerably. Since the area of the drain regions 1a, 2a of the driver MOS transistors $Q_1$, $Q_2$ which define nodes $N_1$, $N_2$, respectively, is larger than that of the conventional memory cell having the same area, the node capacitance is correspondingly large, which means that it is possible to enhance the resistance to disturbance such as alpha particles. Further, since each transfer MOS transistor is formed integrally with the corresponding load resistor within the second-level polycrystalline silicon layer, the number of contact portions is reduced and the reliability is thus improved.

Figure 3:
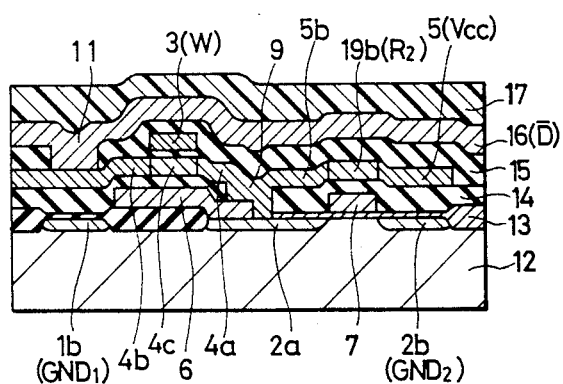
FIG. 3 is a sectional view taken along the line X—X' of FIG. 2.

FIG. 3 shows the cross-sectional structure of the memory cell shown in FIG. 2, taken along the line X—X' of FIG. 2. A field insulator film 13 is formed on a semiconductor substrate 12, and first-level polycrystalline silicon layers 6 and 7 are stacked thereon by, for example, the LPCVD (low-pressure CVD) method. Then, n+-layers 1b, 2a and 2b are formed by ion implantation. The first-level polycrystalline silicon layer may be replaced with a polycide formed by stacking a silicide and polycrystalline silicon one upon the other, or a silicide alone, or a refractory metal. Then, an intermediate insulator film 14 is stacked, and an ohmic contact portion 9 is formed. Thereafter, a second-level polycrystalline silicon layer 5 is stacked. The source and drain regions 4b, 4a and channel region 4c of the transfer MOS transistor $Q_3$, together with the load resistor $R_2$ (19b) are formed in the second-level polycrystalline silicon layer 5. In order to improve the characteristics of the transfer MOS transistor, the polycrystalline silicon layer is subjected to a known hydrogenating treatment such as the hydrogen plasma treatment to thereby lower both the grain boundary potential and the grain boundary energy level. Alternatively, at least the source 4b, drain 4a and channel region 4c are formed into single crystal. Formation of single crystal may be carried out by any known method such as laser annealing, lateral solid-phase epitaxy. Then, a gate insulator film is formed, and an impurity, for example, arsenic, is ion-implanted into the whole area except for the gate electrode 3 (the third-level polycrystalline silicon layer), the channel region 4c of the transfer MOS transistor and the load resistor $R_2$ (19b), thus forming source and drain layers and wiring layers. The region of the second-level polycrystalline silicon layer 5 except for the channel region and the load resistor may be formed using a polycide structure. The third-level polycrystalline silicon layer 3 may be replaced with a polycide, a silicide or a refractory metal. Then, an intermediate insulator film 15 is stacked, and an ohmic contact portion 11 is formed. Thereafter, a metal wiring 16 is formed using, for example, aluminum, to define a data line $\overline{D}$. Finally, a passivation film 17 is formed.

As has been described above, according to the present invention, transfer MOS transistors in a memory cell of a semiconductor memory such as a static RAM are formed within a second-level polycrystalline silicon layer, and the memory cell area is therefore reduced considerably. Accordingly, it is possible to achieve high integration of the memory. Further, since the node capacitance is made larger than that of the conventional memory cell having the same area, it is possible to enhance the resistance to disturbance such as alpha particles, so that there is no fear of data being readily lost due to such disturbance.

What is claimed is:

1. A semiconductor memory including a pair of driver MOS elements constituting a flip-flop, a pair of resistor elements and a pair of transfer MOS elements for address selection, comprising:
    gate electrodes for said pair of driver MOS elements which are formed by respective first and second parts of a first-level polycrystalline silicon layer;
    source and drain regions for said pair of transfer MOS elements for address selection which are disposed within a second-level polycrystalline silicon layer; and
    gate electrodes for said pair of transfer MOS elements which are disposed in respective parts of a third-level polycrystalline silicon layer.

2. A semiconductor memory according to claim 1, wherein said second-level polycrystalline silicon layer is used as a power supply potential line.

3. A semiconductor memory according to claim 1, wherein said third-level polycrystalline silicon layer is used as a word line.

4. A semiconductor memory according to claim 1, wherein the source regions of said driver MOS elements are used as ground potential lines.

5. A semiconductor memory according to claim 1, wherein said pair of resistor elements comprise resistors formed in respective regions of said second-level polycrystalline silicon layer.

6. A semiconductor memory according to claim 1, wherein said first, second and third-level polycrystalline silicon layers are vertically disposed in a semiconductor memory device, and wherein said third-level layer is disposed above said second-level layer and said second-level layer is disposed above said first-level polycrystalline silicon layer.

7. A semiconductor memory according to claim 6, wherein said layers are separated from each other via individual insulating films.

8. A semiconductor memory according to claim 7, wherein said pair of driver MOS elements have source and drain regions formed in a substrate layer of said semiconductor memory device and wherein said first-level polycrystalline silicon layer parts which form said gate electrode orthogonally extend over respective channel regions of said driver MOS elements and are isolated therefrom via a gate insulating film.

9. A semiconductor memory according to claim 8, wherein MOS elements comprise MOS transistors.

10. A semiconductor memory according to claim 9, wherein said third-level polycrystalline silicon layer is used as a word line.

11. A semiconductor memory according to claim 8, wherein said pair of resistor elements comprise resistors formed in respective regions of said second-level polycrystalline silicon layer.

12. A semiconductor memory according to claim 11, wherein said second-level polycrystalline silicon layer is used as a power supply potential line.

13. A semiconductor memory according to claim 12, wherein the source regions of said driver MOS elements are used as ground potential lines.

14. A semiconductor memory comprising:
    a first driver MOS transistor having source and drain regions within a semiconductor substrate and a gate electrode defined by the intersection between said source and drain regions and a first-level polycrystalline silicon layer which crosses said source and drain regions;
    a second driver MOS transistor having independent source and drain regions within said semiconductor substrate, said drain region being in ohmic contact with the gate electrode of said first driver MOS transistor, said second driver MOS transistor having a gate electrode defined by the intersection between said source and drain regions and a second first-level polycrystalline silicon layer which is formed so as to cross said source and drain regions and having one end thereof brought into ohmic contact with the drain region of said first driver MOS transistor;
    two transfer MOS transistors respectively having source and drain regions defined by extending portions of first and second branched second-level polycrystalline silicon layers which are independently branched from a second-level polycrystalline silicon layer formed as a power supply potential line and which are formed so as to be independently brought into ohmic contact with the respective drain regions of said first and second driver MOS transistors, said extending portions extending beyond the corresponding ohmic contact portions, the drain region of each of said transfer MOS transistors being defined by the side of said extending portion which is closer to the corresponding ohmic contact portion, and each of said transfer MOS transistors having a gate electrode defined by the intersection between the corresponding source and drain regions and a third-level polycrystalline silicon layer which crosses said source and drain regions, said third-level polycrystalline silicon layer defining a word line;
    two load resistors respectively formed in those regions of said first and second branched second-level polycrystalline silicon layers which are located between the corresponding ohmic contact portions and a corresponding line for coupling to a power supply;

two metallic data lines respectively brought into ohmic contact with the source regions of said two transfer MOS transistors; and ground wirings are respectively defined by extending portions of the source regions of said two driver MOS transistors.

15. A semiconductor memory according to claim 14, wherein second-level polycrystalline silicon layer and said third-level polycrystalline silicon layer are respectively separated from said first-level polycrystalline silicon layer and said second-level polycrystalline silicon layer in a vertical direction via individual insulating films.

16. A semiconductor memory comprising:

a first driver MOS transistor having source and drain regions within a semiconductor substrate and a gate electrode defined by the intersection between said source and drain regions and a first-level conducting layer which crosses said source and drain regions;

a second driver MOS transistor having independent source and drain regions within said semiconductor substrate, said drain region being in ohmic contact with the gate electrode of said first driver MOS transistor, said second driver MOS transistor having a gate electrode defined by the intersection between said source and drain regions and a second first-level conducting layer which is formed so as to cross said source and drain regions and having one end thereof brought into ohmic contact with the drain region of said first driver MOS transistor;

a pair of transfer MOS transistors respectively having source and drain regions defined by extending portions of first and second branched second-level conducting layers which are independently branched from a second-level conducting layer formed as a power supply potential line and which are formed so as to be independently brought into ohmic contact with the respective drain regions of said first and second driver MOS transistors, said extending portions extending beyond the corresponding ohmic contact portions, the drain region of each one of said pair of transfer MOS transistors being defined by the side of said extending portion which is closer to the corresponding ohmic contact portion, and each one of said pair of transfer MOS transistors having a gate electrode defined by the intersection between the corresponding source and drain regions and a third-level conducting layer which crosses said source and drain regions, said third-level conducting layer defining a word line;

a pair of load resistors respectively formed in those regions of said first and second branched second-level conducting layers which are located between the corresponding ohmic contact portions and a corresponding line for coupling to a power supply;

a pair of metallic data lines respectively brought into ohmic contact with the source regions of said two transfer MOS transistors; and ground wirings respectively defined by extended portions of the source regions of said two driver MOS transistors.

17. A semiconductor memory according to claim 16, wherein said first-level conducting layer is comprised of a polycide layer including a stacking of a silicide and a polycrystalline silicon.

18. A semiconductor memory according to claim 16, wherein said first-level conducting layer is comprised of one of a polycide, a silicide and a refractory metal.

19. A semiconductor memory according to claim 16, wherein said first and third-level conducting layers are comprised of a polycide layer including a stacking of a silicide and a polycrystalline silicon.

20. A semiconductor memory according to claim 19, wherein said second conducting layer which constitutes the source and drains regions of said pair of transfer MOS transistors and said branched layer for forming said power supply potential line is comprised of a polycide.

21. A semiconductor memory according to claim 16, wherein said first and third-level conducting layers are comprised of one of a polycide, a silicide and a refractory metal.

22. A semiconductor memory according to claim 21, wherein said second conducting layer which constitutes the source and drain regions of said pair of transfer MOS transistors and said branched layer for forming said power supply potential line is comprised of a polycide.

23. In a semiconductor memory including a cross-coupled bistable arrangement of a pair of driver MOS transistors, each being series connected with a load resistor between a power supply potential line and a ground potential line, and further including a pair of transfer MOS transistors having their gate electrodes coupled to a word line and each one coupled between a respective data line and a drain of a respective driver MOS transistor, wherein the improvement comprises:

gate electrodes of said pair of driver MOS transistors which are formed in a first-level polycrystalline silicon layer are separated via an insulating film from and orthogonally crossing over the respective channel regions of the individual driver MOS transistors wherein the source and drains are formed in a substrate region;

source and drain regions of said pair of transfer MOS transistors which are formed in respective portions of a second-level polycrystalline silicon layer formed as a power supply potential line, said second-level layer being disposed above said first-level layer and separated therefrom via an intermediate insulating film; and gate electrodes of said pair of transfer MOS transistors which are formed in a portion of a third-level polycrystalline silicon layer, said third-level layer being disposed above said second-level layer and separated therefrom via a further intermediate insulating film.

24. In a semicondutor memory according to claim 23, wherein gate-to-drain cross-coupled bistable connections between said pair of driver MOS transistors are effected by respective ohmic contacts.

25. In a semiconductor memory according to claim 24, wherein the drain of each of said pair of transfer MOS transistors is in ohmic contact with a respective drain of said driver MOS transistor.

26. In a semiconductor memory according to claim 25, wherein said pair of load resistors are disposed in respective portions of said second-level polycrystalline silicon layer so that each of said transfer MOS transistors is integrally formed with one of said pair of load resistors.

* * * * *